(12) United States Patent
Huang et al.

(10) Patent No.: US 8,242,381 B2
(45) Date of Patent: Aug. 14, 2012

(54) CHIP-LEVEL THROUGH HOLE STRUCTURE OF ELECTRONIC PACKAGE

(75) Inventors: Chung-Er Huang, Taipei (TW); Chien-Yu Huang, Taipei (TW)

(73) Assignee: Azurewave Technologies, Inc., Taipei (TW)

( * ) Notice: Subject to any disclaimer, the term of this patent is extended or adjusted under 35 U.S.C. 154(b) by 1052 days.

(21) Appl. No.: 11/856,223

(22) Filed: Sep. 17, 2007

(65) Prior Publication Data

US 2009/0021329 A1 Jan. 22, 2009

(30) Foreign Application Priority Data

Jul. 20, 2007 (TW) ................................ 96126725 A

(51) Int. Cl.
*H05K 1/11* (2006.01)
(52) U.S. Cl. ........................................ 174/262; 361/792
(58) Field of Classification Search .......... 174/263–266; 361/792–795; 29/852–853
See application file for complete search history.

(56) References Cited

U.S. PATENT DOCUMENTS

| 6,091,027 | A | * | 7/2000 | Hesselbom et al. | .......... 174/255 |
| 2006/0118329 | A1 | * | 6/2006 | Nakamura | ................ 174/260 |
| 2007/0020907 | A1 | * | 1/2007 | Miyazaki et al. | ............. 438/597 |
| 2008/0308922 | A1 | * | 12/2008 | Zhang et al. | .................. 257/690 |

* cited by examiner

*Primary Examiner* — Jeremy Norris
(74) *Attorney, Agent, or Firm* — Rosenberg, Klein & Lee

(57) ABSTRACT

A through-hole structure for a wafer level packaging includes a wafer, a RF passage penetrating through the wafer, and a through-hole structure disposed around the RF passage. The through-hole structure has three types of structure. The through hole structure includes a plurality of holes filled with metal material thereinside. On the other hand, the through hole structure can be a plurality of holes coated with a metal layer on the internal surface thereof. Alternatively, the through hole structure has both of the two above hole structure. Depending on the structure, the through hole structure performs an electric reference for preventing the RF signal from decay or interference.

6 Claims, 3 Drawing Sheets

CHIP-LEVEL THROUGH HOLE STRUCTURE OF ELECTRONIC PACKAGE

BACKGROUND OF THE INVENTION

1. Field of the Invention

The present invention relates to an chip-level through hole structure of electronic package and in particular to a package structure with through hole structures for preventing the decay of signal.

2. Description of Prior Art

Depending on the development of the semiconductor processes, the processes of 0.13/0.18 micro-meter, or 90 nano-meters are applied for the RF (ratio frequency) device so that the RFIC can be employed for higher frequency and higher integrity system. For example, the RFIC will be used for higher frequency and high bandwidth system, such as 3-10 GHz or 60 GHz. Furthermore, a system with higher integrity is a feature demand for extending the application. For instance, the WLAN (wireless LAN) transceiver, the PA (power amplifier) and the T/R (transmit/receive) switch are usually in an integral system. Moreover, the multi-band in single system or multi-system is integrally produced.

With the development of the RF technology, the circuit design of the wireless device is optimized for low-weight, small-size, high-quality, low-cost, low energy-consumption, and high reliability. The above characteristics are provided for the development of the technology and the market of the RF/wireless circuit device. The high frequency circuit design plays an important role for the RF/wireless integrate circuit and an optimized design can promote the design margin on the design process so that the yield is improved and the produced cost is decreased.

Therefore, in view of this, the inventor proposes the present invention to overcome the above problems based on his expert experience and deliberate research.

SUMMARY OF THE INVENTION

The primary object of the present invention is provide for an chip-level through hole structure of electronic package. The structure performs as a reference potential for an electrical shielding so that the decaying and the interference of the signal are reduced.

In order to achieve the above object, the present invention provides an chip-level through hole structure of electronic package. The structure comprises: a wafer having a radio frequency (RF) passage, wherein the radio frequency passage penetrates through the wafer; and a through hole structure disposed around the radio frequency passage; whereby the through hole structure is a electric reference plane for preventing a signal transmitted inside the radio frequency passage from decaying and interference. The through hole structure can be comprises holes filled with a metal material, or second holes with a metal layer formed on an internal surface thereof, or a combination of the above two hole structures.

The present invention provides a through hole structure applied for a RF circuit and the through hole structure performs a shielding ground so as to improve the transmission quality and the produced yield of the RF device.

In order to better understand the characteristics and technical contents of the present invention, a detailed description thereof will be made with reference to the accompanying drawings. However, it should be understood that the drawings and the description are illustrative but not used to limit the scope of the present invention.

DETAILED DESCRIPTION OF THE INVENTION

Figure 1A:
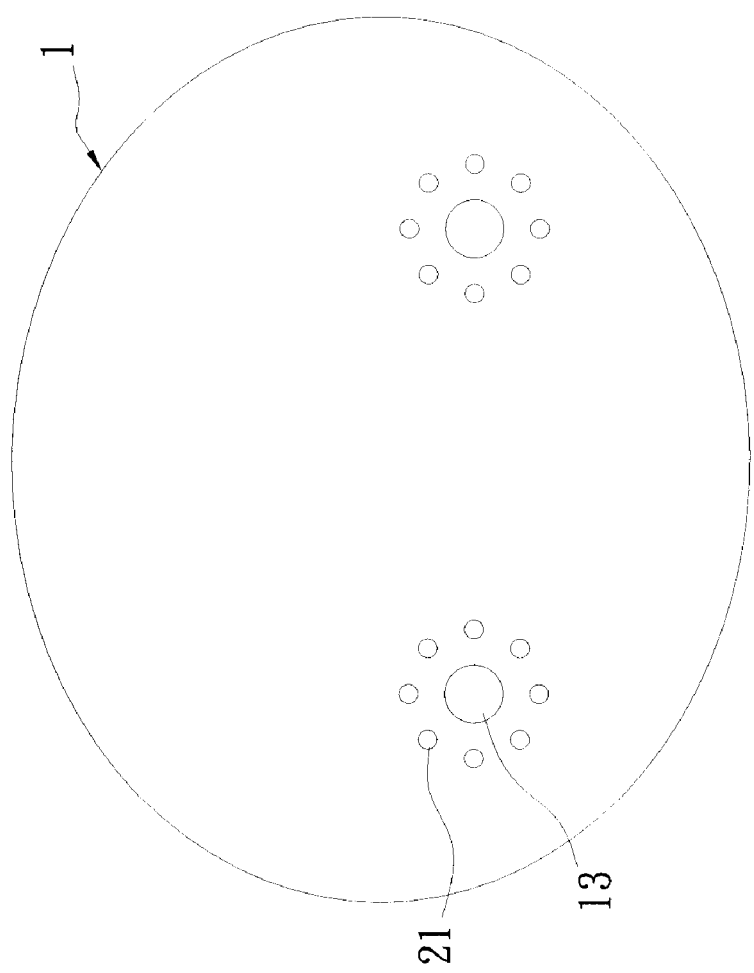
FIG. 1A is a top view showing the first embodiment of the chip-level through hole structure of electronic package according to the present invention.

The invention discloses a chip-level through hole structure of electronic package for preventing a RF signal transmitted inside the radio frequency passage from decaying and interference. Please refer to FIGS. 1A and 1B, the chip-level through hole structure of electronic package comprises a wafer 1 and in the embodiment the wafer 1 is but not limited to a silicon wafer. The wafer 1 has a front side 11 and a back side 12 corresponding to the front side 11. At least one radio frequency (RF) passage 13 is disposed on and penetrates through the wafer 1. The RF passage 13 is formed by semiconductor processes, for example TSV (Through Silicon Via) technology.

Furthermore, a through hole structure 2 is disposed on the wafer 1 and around the RF passage 13. The through hole structure 2 acts as a electric reference plane for preventing a signal transmitted inside the RF passage 13 from decaying and interference. In other words, the through hole structure 2 is a shielding-ground plane corresponding to the RF passage 13 so that the signal is prevented form decaying and loss and the quality of transmission is improved.

According to the present invention, the through hole structure 2 can be three types. One type of the through hole structure 2 is a first through hole structure 21, the other type of the through hole structure 2 is a second through hole structure 22, and another type of the through hole structure 2 is a combination of the first through hole structure 21 and the second through hole structure 22 (please refer to FIGS. 2A and 3A).

Figure 1B:
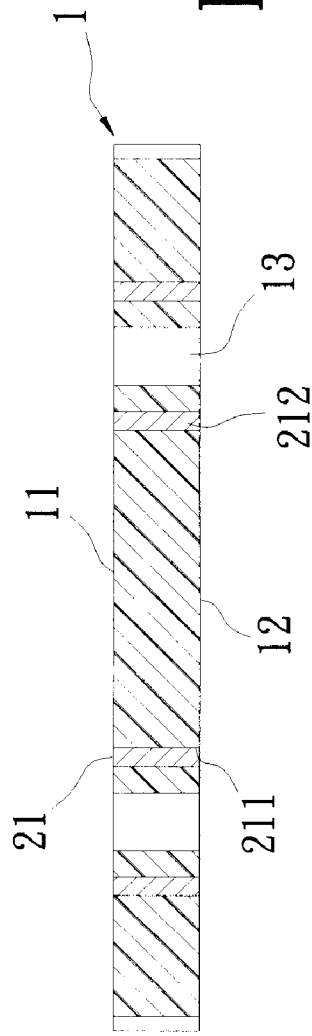
FIG. 1B is a side view showing the first embodiment of the chip-level through hole structure of electronic package according to the present invention.

According to FIGS. 1A and 1B, the through hole structure 2 is a first through hole structure 21. The first through hole structure 21 comprises a plurality of first holes 211 and the first holes 211 are arranged around the RF passage 13. Each first hole 211 is filled with a metal material 212 and the metal material 212 is conductive metal. In other words, the metal material 212 has good conductivity, for example a tungsten material. The metal material 212 is formed by semiconductor process, for example a metal sputtering process, or an electroless process, but the processes for coating the metal material 212 is not restricted above. Please refer to FIG. 1A, the first through hole structure 21 comprising a plurality of first holes 211 filled with the metal material 212 is disposed around each RF passage 13 to prevent from the signal interference.

Figure 2A:
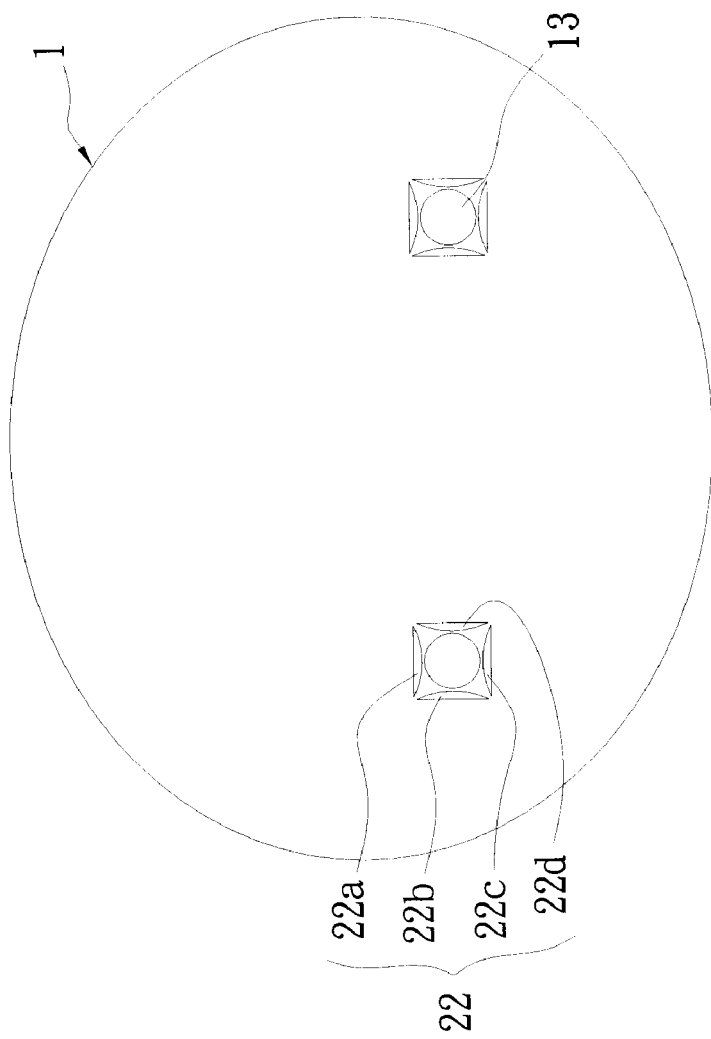
FIG. 2A is a top view showing the second embodiment of the chip-level through hole structure of electronic package according to the present invention.
Figure 2B:
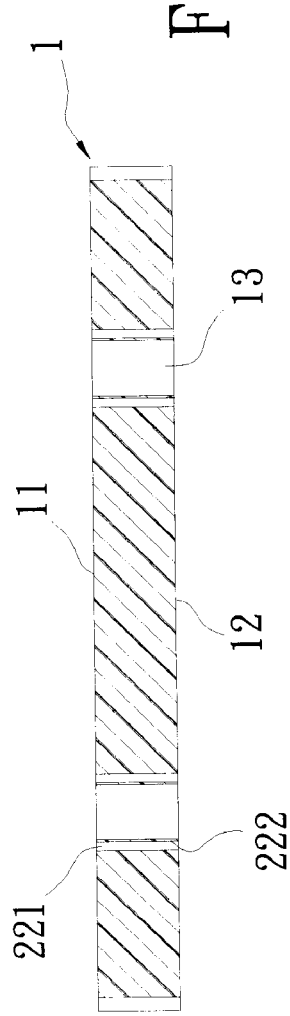
FIG. 2B is a side view showing the second embodiment of the chip-level through hole structure of electronic package according to the present invention.
Figure 3A:
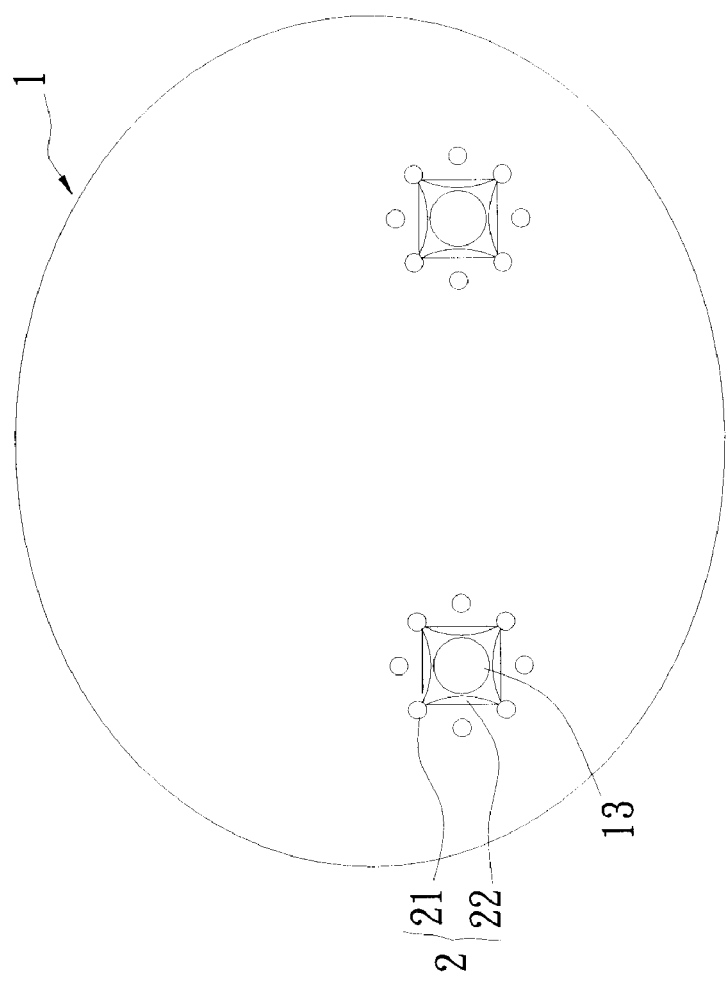
FIG. 3A is a top view showing the third embodiment of the chip-level through hole structure of electronic package according to the present invention.
Figure 3B:
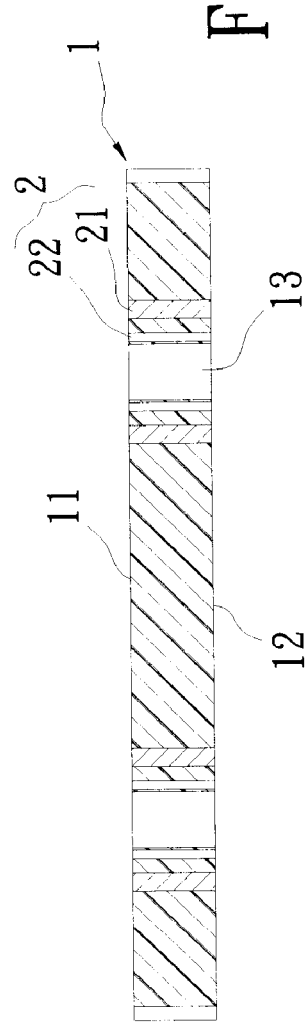
FIG. 3B is a side view showing the third embodiment of the chip-level through hole structure of electronic package according to the present invention.

According to FIGS. 2A and 2B, the second embodiment of the present invention is shown. In the embodiment, the through hole structure 2 is a second through hole structure 22. Similarly, at least one radio frequency (RF) passage 13 is disposed on and penetrates through the wafer 1 and the second through hole structure 22 is arranged around the RF passage 13. The second through hole structure 22 comprises a plurality of second holes 221 and a metal layer 222 formed on the internal surface of each second hole 221. The metal layer 222 is formed of a conductive metal. In other words, the metal layer 222 has good conductivity, for example a tungsten material, but the metal layer 222 is not restricted to the above material. The metal layer 222 is formed by semiconductor process, for example a metal sputtering process, or an electroless-plating process, but the processes for coating the metal layer 222 is not restricted above. As the above mentioned structure, the metal layer 222 is coated on the internal surface of the second holes 221 for shielding the signal. In addition, each second hole 221 is arranged another second hole 221 in a parallel manner and the radio frequency (RF) passage 13 is disposed between each two parallel second hole 221. Please refer to FIG. 2A, four second holes 22a, 22b, 22c and 22d are disposed around each radio frequency (RF) passage 13. In the embodiment, the second holes 22a and 22b are parallel to the second holes 22c and 22d respectively. In other words, the second holes 221 are disposed in pair around the radio frequency (RF) passage 13. Thus, the second through hole structure 22 is a reference potential for an electrical shielding so that the decaying and the interference of the signal are reduced. Please refer to FIGS. 3A and 3B, the third embodiment of the present invention is shown. Similarly, at least one radio frequency (RF) passage 13 is disposed on the wafer 1. The through hole structure 2 is the combination of the first through hole structure 21 and the second through hole structure 22. In detail, the first through hole structure 21 and the second through hole structure 22 are simultaneously disposed around each radio frequency (RF) passage 13 so as to improve the quality of transmission. In this embodiment, the second through hole structure 22 is disposed around the radio frequency (RF) passage 13 and the first through hole structure 21 is further disposed around the second through hole structure 22. As the above structure, the second through hole structure 22 comprises a plurality of second holes 221 and a metal layer 222 formed on the internal surface of each second hole 221. Each second hole 221 is arranged another second hole 221 in a parallel manner and the radio frequency (RF) passage 13 is disposed between each two parallel second hole 221. In other words, the second through hole structure 22 is arranged between the radio frequency (RF) passage 13 and the first through hole structure 21 and the first through hole structure 21 and the second through hole structure 22 serve as an electrical shielding reference. Moreover, the processes of the third embodiment are the same with that of the first and the second embodiment.

On the contrary, in the third embodiment, the position of the first through hole structure 21 and the position of the second through hole structure 22 can be changed. For example, the first through hole structure 21 can be disposed between the radio frequency (RF) passage 13 and the second through hole structure 22. The structure also achieves the same shielding effect on the signal.

To sum up, the present invention achieves the following advantages:
1. The quality of the signal is improved. The through hole structure 2 serves as an electric grounding reference for preventing the decaying and the interference of the signal.
2. The present invention discloses a device with an improved transmitting passage. Furthermore, the RF device can be provided for better transmitting system.

Although the present invention has been described with reference to the foregoing preferred embodiment, it will be understood that the invention is not limited to the details thereof. Various equivalent variations and modifications may occur to those skilled in this art in view of the teachings of the present invention. Thus, all such variations and equivalent modifications are also embraced within the scope of the invention as defined in the appended claims.

What is claimed is:

1. A chip-level through hole structure of electronic package, comprising:
   a radio frequency (RF) passage defined on a wafer and penetrating there-through;
   a first through hole structure comprising a plurality of discrete through-vias arranged in a circular pattern about the RF passage, each through-via penetrating through the wafer and electrically insulted from the radio frequency passage and from each other; and
   a second through hole structure comprising a plurality pairs of discrete through holes disposed around the RF passage and arranged between the RF passage and the through-vias of the first through hole structure, each through hole penetrating through the wafer and electrically insulated from the RF passage, the first through hole structure, and from each other;
   wherein the through hole structures substantially isolate the radio frequency passage thereinside and define an electric reference plane for preventing a signal transmitted inside the radio frequency passage from decaying and interference.

2. The chip-level through hole structure according to claim 1, wherein the plurality of through-vias of the first through hole structure are filled with a metal material.

3. The chip-level through hole structure according to claim 1, wherein the transverse cross section of the through-holes of the second through hole structure is substantially shaped as a segment of a circle, wherein each pair of the through holes is arranged symmetrically about the RF passage.

4. The chip-level through hole structure according to claim 3, wherein the internal surface that defines each of the through holes is coated with a metal layer.

5. The chip level through hole structure according to claim 3, wherein for each of the through holes having a transverse cross section of a segment of a circle, the chord that defines the segment is arranged away from the RF passage, and
   wherein the chords of the segments of the through holes are arranged substantially in a regular polygonal pattern around the RF passage.

6. The chip level through hole structure according to claim 5, wherein through holes are arranged in a substantially rectangular pattern around the RF passage.

* * * * *